United States Patent
Jeong (10) Patent No.: US 7,609,195 B2
(45) Date of Patent: Oct. 27, 2009

(54) ON DIE THERMAL SENSOR AND METHOD FOR GENERATING THERMAL CODE OF ODTS

(75) Inventor: Chun-Seok Jeong, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/003,678

(22) Filed: Dec. 31, 2007

(65) Prior Publication Data

US 2008/0158036 A1 Jul. 3, 2008

(30) Foreign Application Priority Data

Jan. 3, 2007 (KR) .................. 10-2007-0000410

(51) Int. Cl.
*H03M 1/10* (2006.01)
(52) U.S. Cl. .................. 341/164; 341/169; 341/138; 365/211; 174/170
(58) Field of Classification Search ......... 341/138–140, 341/164, 169, 170; 365/189.09, 211, 222, 365/227; 374/170, 171, 172, 141; 711/105, 711/106

See application file for complete search history.

(56) References Cited

U.S. PATENT DOCUMENTS

| | | | |
|---|---|---|---|
| 3,979,745 A * | 9/1976 | Bishop | 341/140 |
| 5,784,328 A | 7/1998 | Irrinki et al. | |
| 5,875,142 A * | 2/1999 | Chevallier | 365/212 |
| 5,994,752 A | 11/1999 | Sander et al. | |
| 6,252,209 B1 * | 6/2001 | Liepold | 219/501 |
| 6,281,760 B1 | 8/2001 | Koelling et al. | |
| 6,867,470 B1 * | 3/2005 | Lorenz | 374/178 |
| 7,127,368 B2 | 10/2006 | Choi | |
| 7,164,310 B1 * | 1/2007 | Nauleau et al. | 327/540 |
| 2004/0162697 A1 * | 8/2004 | Smith et al. | 702/132 |
| 2006/0111865 A1 | 5/2006 | Choi | |
| 2006/0158214 A1 | 7/2006 | Janzen et al. | |
| 2007/0140315 A1 * | 6/2007 | Janzen et al. | 374/170 |
| 2008/0144415 A1 * | 6/2008 | Macerola et al. | 365/211 |
| 2008/0259998 A1 * | 10/2008 | Venkataraman et al. | 374/170 |

FOREIGN PATENT DOCUMENTS

| | | |
|---|---|---|
| KR | 0157108 | 7/1998 |
| KR | 10-2003-0035767 | 5/2003 |
| KR | 10-2005-0067520 | 7/2005 |
| KR | 10-2005-082579 | 8/2005 |
| KR | 10-2005-0082585 | 8/2005 |
| KR | 10-0666178 | 1/2007 |
| KR | 10-2007-0109107 | 11/2007 |

OTHER PUBLICATIONS

Korean Office Action, with English translation, issued in Korean Patent Application No. KR 10-2007-0000410, mailed Feb. 20, 2008, portions selectively omitted.
Korean Notice of Allowance issued in Korean Patent Application No. KR 10-2007-0000410, mailed May 14, 2008.

* cited by examiner

*Primary Examiner*—Howard Williams
(74) *Attorney, Agent, or Firm*—IP & T Law Firm PLC (57) ABSTRACT

An on die thermal sensor (ODTS) in a memory device includes: a band gap unit for detecting a temperature of the memory device to output a first voltage corresponding to the temperature; and an analog-to-digital converting unit for outputting a digital code having temperature information based on the first voltage, the digital code having varied resolution according to temperature ranges.

22 Claims, 5 Drawing Sheets

ON DIE THERMAL SENSOR AND METHOD FOR GENERATING THERMAL CODE OF ODTS

CROSS-REFERENCE TO RELATED APPLICATIONS

The present invention claims priority of Korean patent application number 10-2007-0000410, filed on Jan. 3, 2007, which is incorporated by reference in its entirety.

BACKGROUND OF THE INVENTION

The present invention relates to an On Die Thermal Sensor (ODTS), and a method for generating a thermal code of the ODTS, and more particularly, an ODTS and a method capable of increasing a temperature detecting region of the ODTS.

Generally, an ODTS is used for measuring a temperature in various semiconductor devices. Hereinafter, an application to a dynamic random access memory (DRAM), which is one of the semiconductor devices, is described.

A DRAM cell includes a transistor to be operated as a switch and a capacitor for storing a charge, i.e., data. According to whether the capacitor stores the charge, i.e., whether a terminal voltage of the capacitor is high or low, a logic level of the data is determined as a high level (logic 1) or a low level (logic 0).

Since the data is stored in the capacitor in the form of an accumulated electrical charge, it would be ideal that there is no power consumption of the stored charge. However, since there occurs a leakage current due to a PN junction of a metal oxide semiconductor (MOS) transistor, the stored initial charge may be discharged and, thus, the stored data may vanish.

To prevent data loss, the data stored in a memory cell is read and the read data is restored into the memory cell by recharging the memory cell with a normal charge before the data vanishes. This operation should be periodically performed in order to maintain stored data.

The above-mentioned recharging operation is called a refresh operation and, generally, a control of the refresh operation is performed by a DRAM controller. Due to the refresh operation, a refresh power is inevitably consumed. In a case of a battery operated system, which requires less power consumption, reducing power consumption for the refresh operation is very important and is a critical issue.

One method of reducing the power consumption for the refresh operation is changing a refresh period according to a temperature. As the temperature decreases, a data holding time of the DRAM becomes longer. Therefore, by dividing a temperature region into several temperature ranges and by lowering a frequency of a refresh clock at a lower temperature range, a power consumption can be reduced.

Accordingly, it has been required to develop a device for accurately sensing a temperature of the inside of the DRAM and for adjusting a refresh clock frequency.

Figure 1:
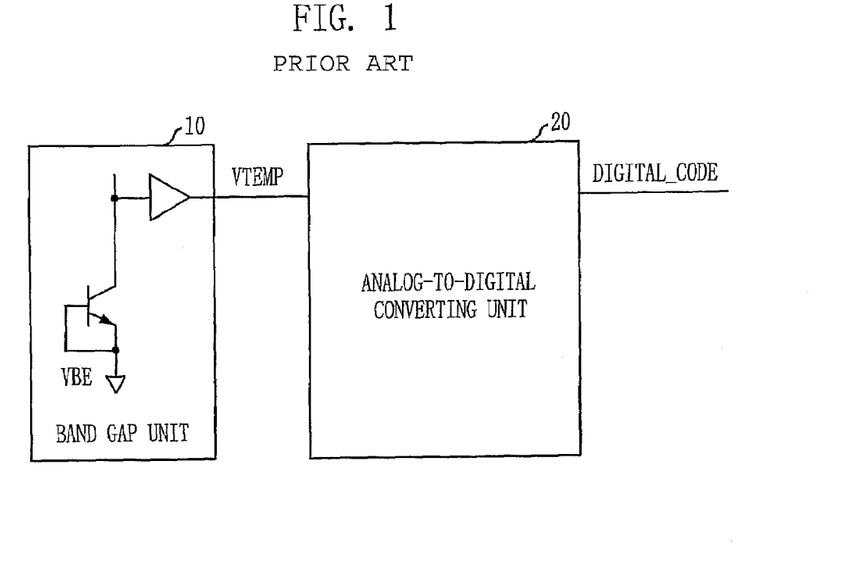
FIG. 1 is a schematic block diagram illustrating a conventional on die thermal sensor (ODTS).

FIG. 1 is a block diagram illustrating a conventional ODTS.

As shown, the conventional ODTS generally includes a band gap unit 10 and an analog-to-digital converting unit 20.

More specifically, the band gap unit 10 detects a temperature of the memory device based on the fact that a voltage level of a base-emitter voltage VBE of a bipolar junction transistor (BJT) changes according to a temperature variation in the ratio of about −1.8 mV/° C. By amplifying the base-emitter voltage VBE of the BJT which is changed finely, the band gap unit 10 outputs a first voltage VTEMP corresponding to the temperature. The base-emitter voltage VBE of the BJT becomes lower as the temperature becomes higher.

The analog-to-digital converting unit 20 converts the first voltage VTEMP output from the band gap unit 10 into a digital code DIGITAL_CODE to be outputted. Generally, a tracking analog-to-digital converter is used as the analog-to-digital converting unit 20.

The tracking analog-to-digital converter tracks the first voltage VTEMP by using a second voltage DACOUT to generate the digital code DIGITAL_CODE. Hereinafter, an operation of the tracking analog-to-digital converter is described in detail.

First, the tracking analog-to-digital converter compares the first voltage VTEMP with the second voltage DACOUT and increases or decreases the digital code DIGITAL_CODE according to the comparison result. At this time, the second voltage is increased or decreased along with the digital code DIGITAL_CODE and the increased or decreased second voltage is compared again to the first voltage VTEMP. By repeating the above process, the second voltage tracks the first voltage VTEMP, and the digital code DIGITAL_CODE corresponding to the first voltage VTEMP is outputted.

In short, when the band gap unit 10 outputs the first voltage VTEMP having temperature information, the analog-to-digital converting unit 20 converts the first voltage VTEMP into the digital code DIGITAL_CODE corresponding to the temperature information and outputs the digital code DIGITAL_CODE.

When the ODTS has a sensing ability for a broad temperature region, the power management and the system management of the memory device using the ODTS improves. This improvement may be obtained by a fine temperature management based on the detected temperature information of the broad range.

However, for the ODTS to cover the broad temperature region, there is a corresponding die dimension increase and a power consumption problem due to an increase in circuits for outputting additional information.

SUMMARY OF THE INVENTION

Embodiments of the present invention are directed to providing an ODTS and a method for widening temperature ranges without increasing the dimensions of the ODTS.

In accordance with a first embodiment, there is provided an ODTS in a memory device, including: a band gap unit for detecting a temperature of the memory device to output a first voltage corresponding to the temperature; and an analog-to-digital converting unit for outputting a digital code having temperature information based on the first voltage, the digital code having varied resolution according to temperature ranges.

In accordance with a second embodiment, there is provided a memory device, including: an ODTS for outputting a digital code including temperature information by detecting a temperature of the memory device, the digital code having varied resolution according to temperature ranges; a signal converter for converting the digital code into a form which is needed in the memory device; and a self-refresh oscillator for controlling a self-refresh period of the memory device according to an output signal of the signal converter.

In accordance with a third embodiment, there is provided a method for generating a thermal code of an ODTS including: outputting a first voltage by detecting a temperature of the memory device; comparing the first voltage with a second voltage; increasing or decreasing a digital code based on the comparison result; and generating the second voltage in response to the digital code, wherein a slope of the second voltage is varied according to temperature ranges.

DESCRIPTION OF SPECIFIC EMBODIMENTS

Embodiments of the present invention relate to an ODTS and a method for generating a thermal code of the ODTS Hereinafter, an ODTS having a different resolution according to temperature ranges in accordance with exemplary embodiments of the present invention will be described in detail with reference to the accompanying drawings. In accordance with the disclosure, in a temperature range where temperature information is more important, a temperature is detected with greater resolution. In a temperature range where temperature information is less important, a temperature is detected with less resolution. As a result, it is possible to increase operable temperature ranges of the ODTS.

In general, an ODTS is used in various kinds of semiconductor devices, and each device needs different measurement resolution of a temperature, according to temperature ranges. Hereinafter, memory devices using the ODTS are described.

Figure 2:
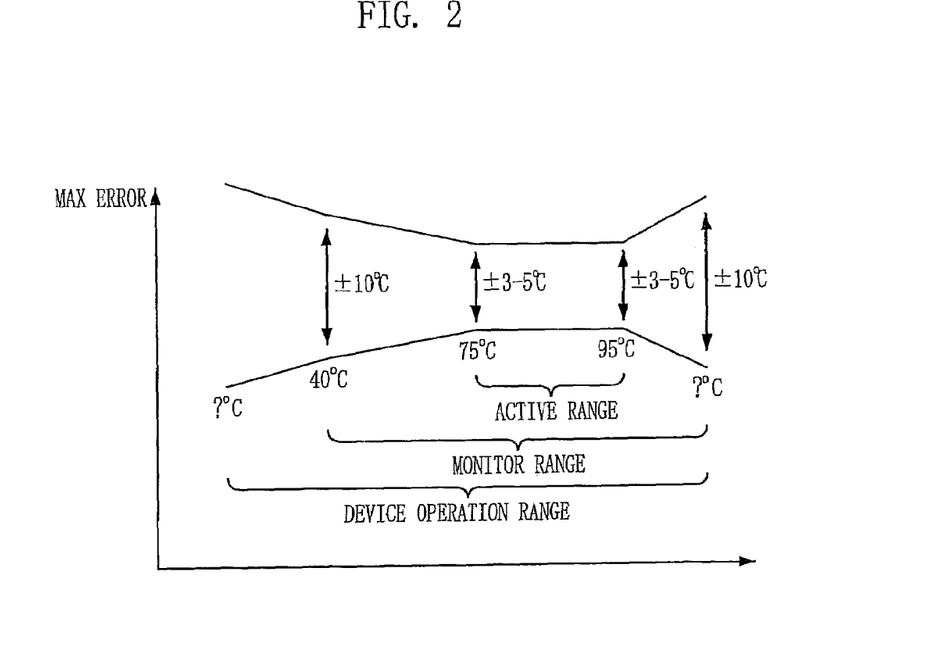
FIG. 2 is a graph illustrating an accuracy of a temperature according to the temperature ranges required by a memory device.

FIG. 2 is a graph showing an accuracy of a temperature according to temperature ranges required by a memory device.

The temperature ranges of the memory device include an active range, a monitor range, and a device operation range. The memory device needs a different resolution of a temperature according to the above ranges.

It is important to control a refresh period of the memory device according to the temperature to maintain a cell data retention in a high temperature range. Therefore, a fine temperature measurement is needed in the active range from about 75° C. to about 95° C. As a result, high resolution and accuracy are needed in the active range. A desired error of the active range ranges from about 3° C. to about 5° C.

However, the monitor range, from about 40° C. to about 75° C. and above 95° C., may have relatively low resolution and accuracy compared with the active range. Also, the device operation range below about 40° C. may have resolution and accuracy lower than those of the active range and the monitor range.

The reason for a memory device to have varying resolution according to the above temperature ranges will be described, hereinafter. In a joint electron device engineering council (JEDEC) specification of a double data rate III (DDR3) synchronous dynamic random access memory (SDRAM), a normal temperature range is prescribed for a range varying from about 0° C. to about 85° C. and an extended temperature range is prescribed for the range varying from about 0° C. to about 95° C. Therefore, at temperatures above 95° C., a guarantee of stable operation is decreased. Further, a temperature below about 75° C., a temperature measurement of the memory device aims not to retain the cell data through a period adjustment, but to decrease a current in a standby state by decreasing the frequency of a refresh operation.

Therefore, the ODTS does not need to output equal resolution temperature information over the entire device operation range and the resolution is varied according to the detected temperature range.

Figure 3:
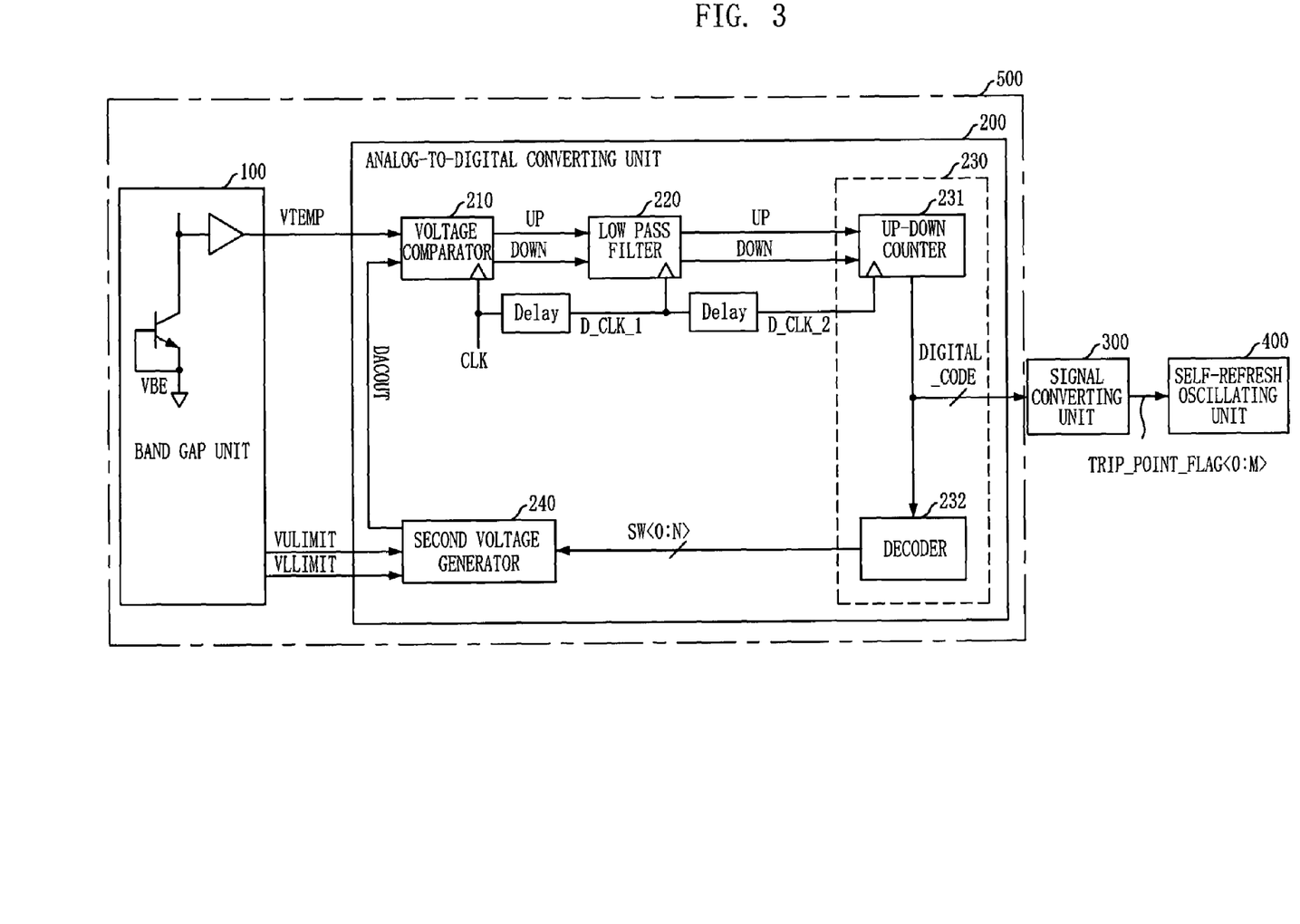
FIG. 3 is a scheme block diagram illustrating an ODTS employed in a memory device.

FIG. 3 is a block diagram of an ODTS employed in a memory device in accordance with a first embodiment.

As shown, the memory device includes a signal converting unit 300, a self-refresh oscillating unit 400, and an ODTS 500. The ODTS 500 detects a temperature of the memory device to output a digital code DIGITAL_CODE having temperature information. The signal converting unit 300 converts the digital code DIGITAL_CODE into a form needed in the memory device to thereby output a flag signal group TRIP_POINT_FLAG<0:M>, M being a positive integer. The self-refresh oscillating unit 400 controls a self-refresh period of the memory device according to the flag signal group TRIP_POINT_FLAG<0:M>.

In detail, the ODTS 500 includes a band gap unit 100 and an analog-to-digital converting unit 200. The band gap unit 100 detects the temperature of the memory device to output a first voltage VTEMP corresponding to the detected temperature. The analog-to-digital converting unit 200 outputs the digital code DIGITAL_CODE having different resolutions according to respective temperature ranges.

In the ODTS 500, the band gap unit 100 outputs the first voltage VTEMP corresponding to each temperature, as described above. The band gap unit 100 detects the temperature of the memory device based on the fact that a voltage level of a base-emitter voltage VBE of a bipolar junction transistor (BJT) changes according to a temperature variation in the ratio of about −1.8 mV/° C. By amplifying the base-emitter voltage VBE of the BJT, the first voltage VTEMP corresponding to the temperature at the rate of 1:1 is generated. Further, the band gap unit 100 outputs maximum and minimum variation voltages VULIMIT and VLLIMIT, each of which has a constant voltage level regardless of the temperature variation.

The analog-to-digital unit 200 converts the first analog voltage VTEMP into the digital code DIGITAL_CODE. The digital code DIGITAL_CODE is generated by a tracking method which increases and decreases the digital code DIGITAL_CODE and a second voltage DACOUT by comparing the first voltage VTEMP with the second voltage DACOUT. An increased or decreased range of the second voltage DACOUT is changed according to the temperature ranges. This feature changes the resolution of the temperature information, i.e., the digital code DIGITAL_CODE outputted from the ODTS 500, according to the temperature ranges.

The analog-to-digital converting unit 200 includes a voltage comparator 210, a low pass filter 220, a code generator 230, and a second voltage generator 240.

The voltage comparator 210 outputs an up-signal UP for increasing the digital code DIGITAL_CODE and a down-signal DOWN for decreasing the digital code DIGITAL_CODE in response to comparing the first voltage VTEMP with the second voltage DACOUT. The low pass filter 220 transmits the up-signal UP and the down-signal DOWN to the code generator 230. The low pass filter 220 blocks signals having a rapid change and outputs signals having a slow change. That is, the low pass filter 220 is used for minimizing an effect on an external noise, and thus, an embodiment without the low pass filter 220 is possible. The code generator 230 outputs the digital code DIGITAL_CODE based on the up-signal UP and the down-signal DOWN. Further, the code generator 230 outputs an adjusting code group SW<0:N> by decoding the digital code DIGITAL_CODE, N being a positive integer.

In detail, the code generator 230 includes an up-down counter 231 and a decoder 232. The up-down counter 231 increases or decreases a digital value based on the up-signal UP or down-signal DOWN to thereby generate the digital code DIGITAL_CODE. The decoder 232 is equipped for decoding the digital code DIGITAL_CODE to a form which is easy to generate the second voltage DACOUT. That is, the decoder 232 decodes the digital code DIGITAL_CODE which is a binary code, thereby outputting the adjusting code group SW<0:N> having the number of logic high value (1) corresponding to a value of the digital code DIGITAL_CODE.

The second voltage generator 240 generates the second voltage DACOUT based on the adjusting code group SW<0:N>. In accordance with the present invention, slopes of the second voltage DACOUT to the temperature ranges, corresponding to the adjusting code group SW<0:N>, are different from each other. That is, in a temperature range which needs a high resolution, as the digital code DIGITAL_CODE and the adjusting code group SW<0:N> change, the corresponding second voltage DACOUT only changes a little. In a temperature range which needs a low resolution, as the digital code DIGITAL_CODE and the adjusting code group SW<0:N> change, the corresponding second voltage DACOUT changes a lot.

The maximum variation voltage VULIMIT and the minimum variation voltage VLLIMIT output from the band gap unit 100 are used in setting maximum and minimum limits of the second voltage DACOUT. More specifically, the maximum variation voltage VULIMIT and the minimum variation voltage VLLIMIT are used for generating bias voltages to generate the second voltage DACOUT.

Hereinafter, an operation of the ODTS 500 is described in detail. The voltage comparator 210 compares the first voltage VTEMP with the second voltage DACOUT to output the up-signal UP and the down-signal DOWN according to the comparison result. The code generator 230 increases or decreases the digital code DIGITAL_CODE and the adjusting code group SW<0:N> according to the up-signal UP and the down-signal DOWN. The second voltage generator 240 outputs the second voltage DACOUT in response to the adjusting code group SW<0:N>. The increased or decreased second voltage DACOUT is compared with the first voltage VTEMP and the above process is repeated. Through this process, the second voltage DACOUT tracks the first voltage VTEMP and thus, the digital code DIGITAL_CODE corresponding to the first voltage VTEMP is outputted.

A sequence of the above operation relating to a clock signal CLK is described as follows. The voltage comparator 210 compares the first voltage VTEMP with the second voltage DACOUT in synchronization with the clock signal CLK. The low pass filter 220 filters the up-signal UP and the down-signal DOWN in synchronization with a first delay clock signal D_CLK_1 generated by delaying the clock signal CLK for a predetermined time, e.g., time for 3 comparisons. Likewise, the up-down counter 231 counts the preset digital value in synchronization with a second delay clock signal D_CLK_2 generated by delaying the first delay clock signal D_CLK_1 for a preset time, e.g., an operation time of the low pass filter 220. Herein, the clock signal CLK is a signal output from an external control circuit.

As described above, the memory device includes the ODTS 500 for measuring the temperature of the memory device to output the digital code DIGITAL_CODE. Further, the memory device of the present invention includes the signal converting unit 300 for converting the digital code DIGITAL_CODE into a form used in the memory device to output the flag signal group TRIP_POINT_FLAG<0:M>, and the self-refresh oscillating unit 400 for controlling the self-refresh period of the memory device according to the flag signal group TRIP_POINT_FLAG<0:M>. In the signal converting unit 300, the digital code DIGITAL_CODE is converted into the flag signal group TRIP_POINT_FLAG<0:M>. This will be described with FIG. 7, hereinafter.

Figure 4:
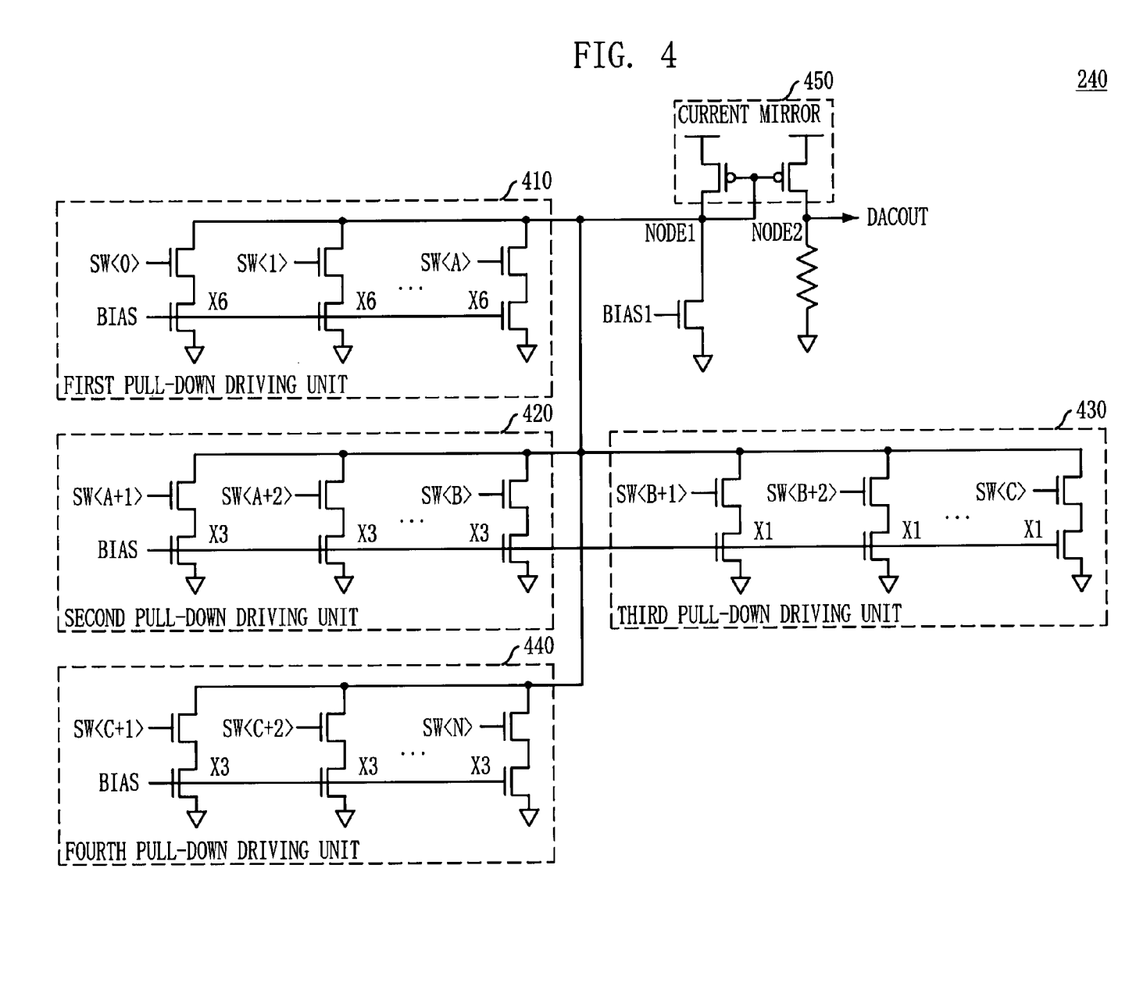
FIG. 4 is a circuit diagram illustrating a second voltage generator shown in FIG. 3.

FIG. 4 is a circuit diagram illustrating the second voltage generator 240 shown in FIG. 3.

As shown, the second voltage generator 240 includes first and second nodes NODE1 and NODE2, and first to fourth driving units 410, 420, 430, and 440. The first to fourth driving units 410 to 440 perform a pull-down driving operation on the first node NODE1. Each of first to fourth pull down driving units 410 to 440 has a different driving ability according to the temperature ranges for a corresponding code set of the adjusting code group SW<0:N>. The second node NODE2 forms a current mirror 450 with the first node NODE1 to output second voltage DACOUT according to an amount of a current flowing therethrough. The current mirror 450 is enabled in response to a first bias voltage BIAS1.

Each of the first to fourth pull-down driving units 410 to 440 includes a plurality of switch transistors and a plurality of current sink transistors. Each of the switch transistors has a gate receiving a corresponding code of adjusting code group SW<0:N> to perform a switching operation. Each of the current sink transistors is coupled in series to a respective switch transistor and has a gate receiving a second bias voltage BIAS to sink the current flowing through the first node NODE1. Each of the current sink transistors has a gate width according to the temperature ranges for the first to fourth driving units 410 to 440.

The first to fourth driving units 410 to 440 control the current flowing through the first node NODE1. The more pull-down driving units in operation, the more current flows on the first node NODE1.

The first to fourth driving units 410 to 440 are operated in response to corresponding code sets of adjusting code group SW<0:N>. The first pull-down driving unit 410 receives a first code set, e.g., first to (A+1)th adjusting codes SW<0> to SW<A> of the adjusting code group SW<0:N> to operate in a device operation range. The second pull-down driving unit 420 receives a second code set, e.g., (A+2)th to (B+1)th adjusting codes SW<A+1> to SW<B> of the adjusting code group SW<0:N> to operate in a monitor range. The third driving unit 430 receives a third code set, e.g., (B+2)th to (C+1)th adjusting codes SW<B+1> to SW<C> to operate in an active range. The fourth driving unit 440 receives a fourth code set, e.g., (C+2)th to (N+1)th adjusting codes SW<C+1> to SW<N> to operate in an over active range which includes an upper portion of the monitor range. Pull-down driving abilities, i.e., current sink abilities, of the current sink transistors are different for each of the first to fourth pull-down driving units 410 to 440 according to the respective temperature ranges. When the current leaking ability of the third driving unit 430 for use in the active range having a highest resolution is 'x1', the current leaking abilities of the other driving units 410, 420, and 440 for use in the device operation range, the monitor range, and the over active range are 'x6', 'x3' and 'x3', respectively, as illustrated in FIG. 4. It is possible to obtain different pull-down driving abilities by adjusting the gate width of the current sink transistors.

Therefore, changes that occur in the current flowing through the first node NODE1 are different according to the temperature ranges for the adjusting code set. That is, when the third code set, e.g., (B+2)th to (C+1)th adjusting codes SW<B+1> to SW<C> of the adjusting code group SW<0:N> on the active range change, the current flowing on the first node NODE1 changes in small increments. However, when the first code set, e.g., first to (A+1)th adjusting codes SW<0> to SW<A> of the adjusting code group SW<0:N> on the device operation range change, the current flowing through the first node NODE1 changes in a large increments.

The first node NODE1 and the second node NODE2 form the current mirror 450. When the current flowing through the first node NODE1 changes, a current flowing on the second node NODE2 changes thereto. Accordingly, the second voltage DACOUT is determined by the current flowing through the second node NODE2 and thus, the second voltage DACOUT is changed according to a variation of the adjusting code group SW<0:N>.

In short, the second voltage DACOUT is generated according to the adjusting code group SW<0:N> and a level of the second voltage DACOUT is changed according to each adjusting code set of the adjusting code group SW<0:N> corresponding to the temperature ranges. This is a difference from a conventional second voltage generator for generating a second voltage DACOUT according to a digital temperature code with constant resolution.

When the second voltage generator 240 is configured as the above, the slope of the second voltage DACOUT corresponding to the digital code DIGITAL_CODE is different according to the temperature ranges. Accordingly, a gate width of a current sink transistor in a pull-down driving unit affected when the digital code DIGITAL_CODE changes incrementally varies according to each temperature range. As a result, the resolution of the ODTS is different according to the temperature ranges.

As explained, the driving ability of the pull-down driving units can be embodied by differentiating the gate width of the current sink transistors. Alternatively, it can be embodied by other methods, such as varying the level of the first bias voltage BIAS1 supplied to a current sink transistor according to the temperature ranges.

Figure 5:
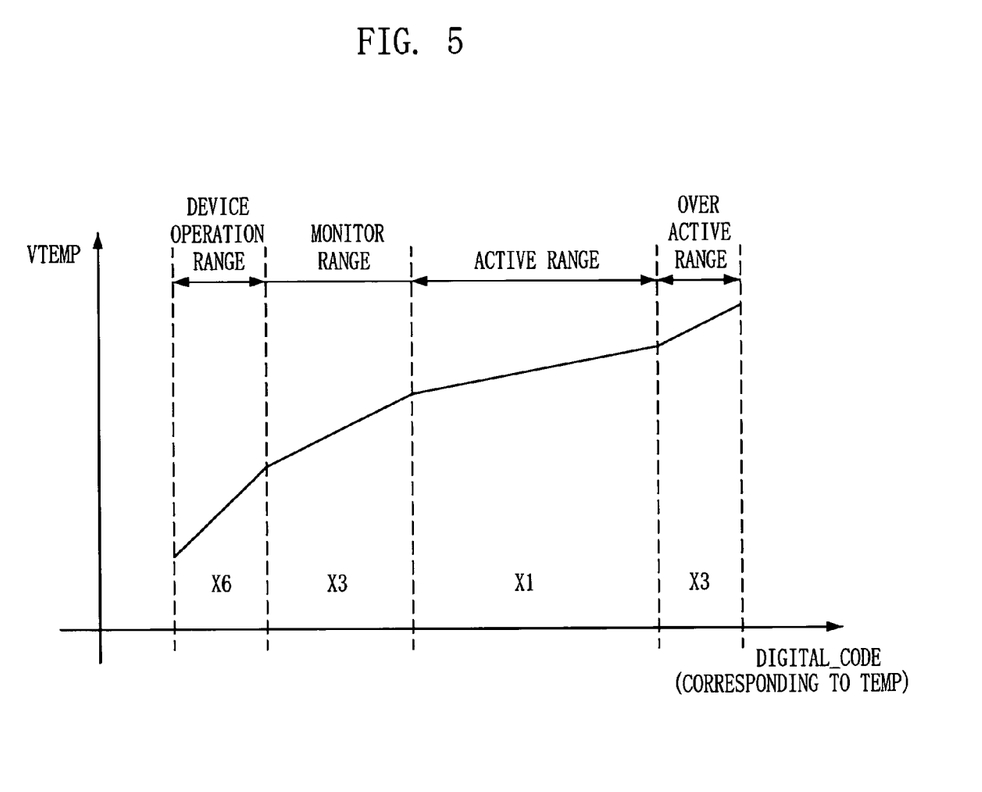
FIG. 5 illustrates a relationship between the first voltage VTEMP (second voltage DACOUT) and corresponding value of digital code DIGITAL_CODE according to each of temperature ranges.

FIG. 5 illustrates a relationship between the first voltage VTEMP (second voltage DACOUT) and corresponding value of digital code DIGITAL_CODE according to each of temperature ranges.

As shown, the slope of the second voltage DACOUT is different according to each of the temperature ranges. The amount of temperature change is represented by an incremental change in DIGITAL_CODE, and thus the resolution of the ODTS is different according to the temperature ranges.

It is possible to set the resolution of DIGITAL_CODE differently according to the temperature ranges. Accordingly, in the temperature range which does not need a high resolution, such as the device operation and monitor ranges, the graph depicts a steep slope. Therefore, a tracking range which DIGITAL_CODE covers the first voltage VTEMP is widened. Consequently, an operable temperature range of the ODTS is widened.

Figure 6:
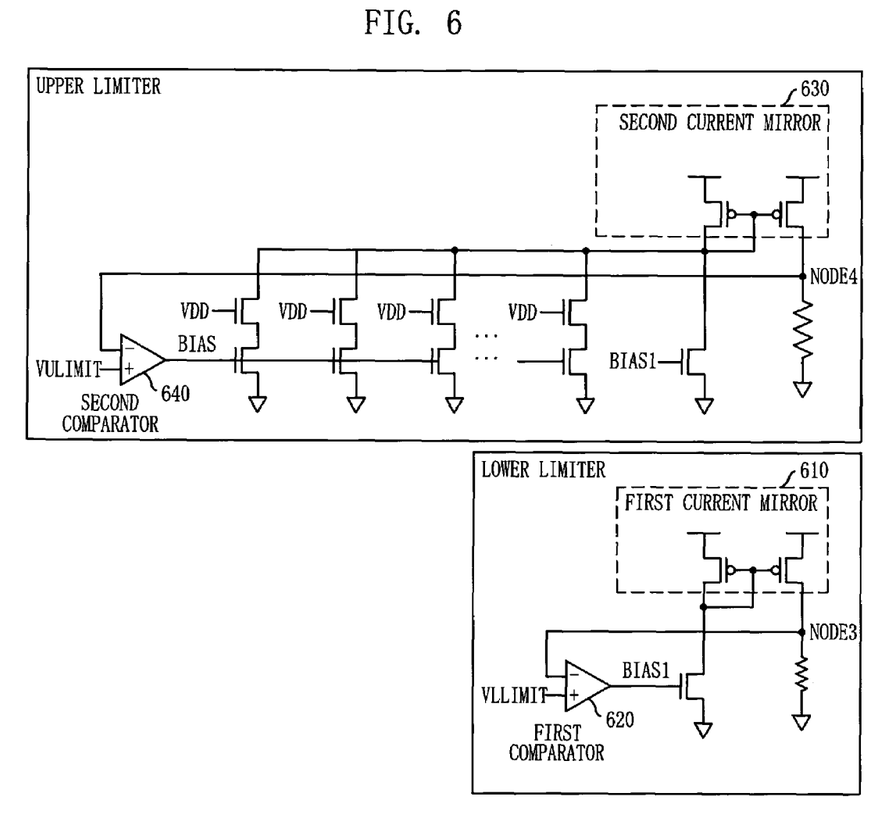
FIG. 6 is a diagram illustrating an upper limiter and a lower limiter for generating first and second bias voltages according to a maximum variation voltage and a minimum variation voltage.

FIG. 6 is a diagram illustrating an upper limiter and a lower limiter for generating first and second bias voltages BIAS1 and BIAS according to a maximum variation voltage VULIMIT and a minimum variation voltage VLLIMIT.

As illustrated, the lower limiter includes a first current mirror 610 for changing a voltage level of a third node NODE3 in response to a voltage level of the first bias voltage BIAS1, and a first comparator 620 for comparing the voltage level of the third node NODE3 and a level of the minimum variation voltage VLLIMIT to change the voltage level of the first bias voltage BIAS1 based on the comparison result. Therefore, the lower limiter adjusts the first bias voltage BIAS1 based on the minimum variation voltage VLLIMIT.

The upper limiter includes a second current mirror 630 for changing a current level of a fourth node NODE4 in response to the second bias voltage BIAS, and a second comparator 640 for comparing the current level of the fourth node NODE4 with that of the maximum variation voltage VULIMIT to change the current level of the second bias voltage BIAS based on the comparison result. Therefore, the upper limiter adjusts the second bias voltage BIAS based on the maximum variation voltage VULIMIT.

The second generator 240 uses the first and second bias voltages BIAS1 and BIAS for biasing to generate the second voltage DACOUT. Accordingly, the second voltage generator 240 outputs the second voltage DACOUT having a voltage in the range from the minimum variation voltage VLLIMIT to the maximum variation voltage VULIMIT, which define the maximum value and the minimum value.

Figure 7:
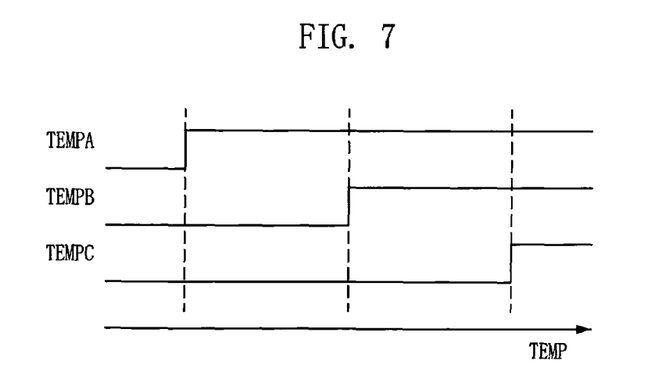
FIG. 7 is a diagram illustrating a flag signal group output from a signal converting unit.

FIG. 7 is a diagram illustrating the flag signal group TRIP_POINT_FLAG<0:M> generated from the signal converting unit 300.

The signal converting unit 300 converts the digital code DIGITAL_CODE into the flag signal group TRIP_POINT_FLAG<0:M>. As shown, it is assumed that the flag signal group TRIP_POINT_FLAG<0:M> includes first to third flag signals TEMPA, TEMPB, and TEMPC. The first to third flag signals TEMPA to TEMPC are activated at certain temperatures, respectively. When the temperature starts to be raised from a value of the lowest temperature, the first flag signal TEMPA detecting the lowest temperature becomes a logic high level. When the temperature becomes higher, exceeding a second temperature, the second flag signal TEMPB becomes a logic high level. When the temperature keeps increasing, exceeding a third temperature, the third flag signal TEMPC becomes a logic high level.

The signal converting unit 300 converts the digital code DIGITAL_CODE into the first to third flag signals TEMPA to TEMPC. The signal converting unit 300 outputs and transmits the converted the first to third flag signals TEMPA to TEMPC to the self-refresh oscillating unit 400. The self-refresh oscillating unit 400 controls the self-refresh period according to the first to third flag signals TEMPA to TEMPC.

Referring to the FIG. 2 again, an operating method of the ODTS is described in detail.

The method for generating a thermal code of the ODTS includes: outputting the first voltage VTEMP corresponding the temperature of the memory device by detecting the temperature; comparing the first voltage VTEMP with the second voltage DACOUT; increasing or decreasing the digital code DIGITAL_CODE based on the comparison result; and generating the second voltage DACOUT which changes according to the digital code DIGITAL_CODE. Wherein, the slope of the second voltage DACOUT which changes according to the digital code DIGITAL_CODE is different according to the temperature ranges.

The slope of the second voltage DACOUT decreases when the resolution of the temperature information which is needed in the system using the ODTS increases.

More specifically, generating the second voltage DACOUT includes: generating the adjusting code group SW<0:N> having the number of logic high value (1) corresponding to the value of the digital code DIGITAL_CODE by decoding the digital code DIGITAL_CODE which is a binary code; and generating the second voltage DACOUT by adjusting the amount of the current flowing on the second node NODE2 shown in FIG. 4. Herein, the second node NODE2 denotes where the second voltage DACOUT is generated.

Further, the second voltage DACOUT tracks the first voltage VTEMP by repeatedly performing the above process, i.e., comparing the first voltage VTEMP with the second voltage DACOUT, increasing or decreasing the digital code DIGITAL_CODE, and generating an updated second voltage DACOUT.

As described above, embodiments of the present invention set a resolution of an ODTS differently according to a range of a temperature. Therefore, this invention widens an operable temperature range while not widening a dimension of the ODTS.

Further, in case of covering the temperature range typical for a conventional ODTS, an ODTS according to this invention has decreased dimensions.

While the present invention has been described with respect to the specific embodiments, it will be apparent to those skilled in the art that various changes and modification may be made without departing from the spirit and scope of the invention as defined in the following claims.

What is claimed is:

1. An on die thermal sensor (ODTS) in a memory device, comprising:
    a band gap unit for detecting a temperature of the memory device and outputting a first voltage corresponding to the temperature; and
    an analog-to-digital converting unit for outputting a digital code having temperature information based on the first voltage,
    wherein the analog-to-digital converting unit generates the digital code having varied resolution according to temperature ranges by using a plurality of pull-down driving units of the analog-to-digital converting unit, each of which has a different driving ability according to the temperature ranges.

2. The ODTS as recited in claim 1, wherein
    the analog-to-digital converting unit generates a second voltage in response to the digital code,
    the analog-to-digital converting unit generates the digital code using a tracking method which increases or decreases the digital code and the second voltage in response to a comparison of the first voltage with the second voltage, and
    a slope of the second voltage is varied according to the temperature ranges.

3. The ODTS as recited in claim 2, wherein the analog-to-digital converting unit includes:
    a voltage comparing unit for outputting an increasing signal and a decreasing signal in response to a comparison of the first voltage with the second voltage;
    a code generating unit for outputting the digital code in response to the increasing signal and the decreasing signal, and an adjusting code group in response to the digital code; and
    a second voltage generating unit for generating the second voltage in response to the adjusting code group, the slope of the second voltage varied in response to the adjusting code group.

4. The ODTS as recited in claim 3, wherein the code generating unit further includes a low pass filter for filtering the increasing signal and the decreasing signal and transmitting them to the code generating unit.

5. The ODTS as recited in claim 3, wherein the second voltage generating unit includes:
    a first node;
    the plurality of pull-down driving units for performing a pull-down driving operation on the first node based on a corresponding code set of the adjusting code group, each pull-down driving unit having a different pull-down driving ability according to the temperature ranges; and
    a second node for forming a current mirror with the first node,
    wherein the second voltage is output at the second node according to an amount of current flowing through the first node.

6. The ODTS as recited in claim 5, wherein each pull-down driving unit includes:
    a plurality of switch transistors each having a gate receiving a corresponding code of the code set of the adjusting code group to perform a switching operation; and
    a plurality of current sink transistors, each coupled in series to a respective switch transistor and having a gate receiving a first bias voltage to sink the current flowing on the first node in response to the first bias voltage;
    wherein the current sink transistors have a gate width according to the temperature range for the pull-down driving unit.

7. The ODTS as recited in claim 3, wherein the code generating unit includes:
    an up-down counter for increasing or decreasing a digital value based on the increasing signal and the decreasing signal to generate the digital code; and
    a decoder for decoding the digital code of a binary code to generate the adjusting code group having the number of logic high value (1) corresponding to a value of the digital code.

8. The ODTS as recited in claim 2, wherein the slope of the second voltage decreases as a resolution of the temperature information required in the memory device including the ODTS increases.

9. The ODTS as recited in claim 2, wherein the band gap unit generates a maximum variation voltage and a minimum variation voltage for setting maximum and minimum limits for the second voltage and providing bias voltages for generating the second voltage.

10. A memory device, comprising:
    an on die thermal sensor (ODTS) for outputting a digital code including temperature information by detecting a temperature of the memory device;
    a signal converter for converting the digital code into a form which is needed in the memory device; and
    a self-refresh oscillator for controlling a self-refresh period of the memory device according to an output signal of the signal converter,
    wherein the ODTS generates the digital code having varied resolution according to temperature ranges by using a plurality of pull-down driving units of the ODTS, each of which has a different driving ability according to the temperature ranges.

11. The memory device as recited in claim 10, wherein the ODTS includes;
    a band gap unit for outputting a first voltage by detecting the temperature of the memory device; and
    an analog-to-digital converter for outputting the digital code based on the first voltage.

12. The memory device as recited in claim 11, wherein
the analog-to-digital converter generates the digital code using a tracking method which increases or decreases the second voltage in response to a comparison of the first voltage with the second voltage, and a slope of the second voltage is varied according to the temperature ranges.

13. The memory device as recited in claim 12, wherein the slope of the second voltage decreases as a resolution of the temperature information required in the memory device including the ODTS increases.

14. The memory device as recited in claim 12, wherein the analog-to-digital converting unit includes:
   a voltage comparing unit for outputting an increasing signal and a decreasing signal in response to a comparison of the first voltage with the second voltage;
   a code generating unit for outputting the digital code in response to the increasing signal and the decreasing signal, and an adjusting code group in response to the digital code; and
   a second voltage generating unit for generating the second voltage in response to the adjusting code group, the slope of the second voltage varied in response to the adjusting code group.

15. The memory device as recited in claim 14, wherein
the code generating unit further includes a low pass filter for filtering the increasing signal and the decreasing signal and transmitting them to the code generating unit.

16. The memory device as recited in claim 14, wherein the second voltage generating unit includes:
   a first node;
   the plurality of pull-down driving units for performing a pull-down driving operation on the first node based on a corresponding code set of the adjusting code group, each pull-down driving unit having a different pull down driving ability according to the temperature ranges; and
   a second node for forming a current mirror with the first node,
   wherein the second voltage is output at the second node according to an amount of the current flowing through the first node.

17. The memory device as recited in claim 16, wherein each pull-down driving unit includes:
   a plurality of switch transistors each having a gate receiving a corresponding code of the code set of the adjusting code group to perform a switching operation; and
   a plurality of current sink transistors, each coupled in series to a respective switch transistor and having a gate receiving a first bias voltage to sink the current flowing on the first node in response to the first bias voltage;
   wherein the current sink transistors have a gate width according to the temperature range for the pull-down driving unit.

18. The memory device as recited in claim 14, wherein the code generating unit includes:
   an up-down counter for increasing or decreasing a preset digital value based on the increasing signal and the decreasing signal to generate the digital code; and
   a decoder for decoding the digital code of a binary code to generate the adjusting code group having the number of logic value (1) corresponding to a value of the digital code.

19. The memory device as recited in claim 10, wherein
the signal converter generates a plurality of flag signals based on the digital code, each flag signal activated according to the temperature, and
the self-refresh oscillator adjusts the self-refresh period according to a flag signal group.

20. A method for generating a thermal code of an ODTS in a memory device, the method comprising:
   outputting a first voltage by detecting a temperature of the memory device;
   comparing the first voltage with a second voltage;
   increasing or decreasing a digital code based on the comparison result, wherein the digital code is a binary code; and
   generating a group of adjusting codes by decoding the digital code, wherein a number of the adjusting codes in the adjusting code group that have a logic value one (1) is adjusted based on the decoded digital code; and
   generating a second voltage by adjusting an amount of a current flowing on a node based on the adjusting code group,
   wherein a slope of the second voltage is varied according to temperature ranges.

21. The method as recited in claim 20, wherein
the slope of the second voltage decreases as a resolution of temperature information required in the memory device including the ODTS increases.

22. The method as recited in claim 20, wherein the second voltage tracks the first voltage by repeatedly performing the comparing of the first voltage with the second voltage, the increasing or decreasing of the digital code, and the generating of the second voltage.

* * * * *